United States Patent
Kim et al.

(10) Patent No.: US 11,245,062 B2
(45) Date of Patent: Feb. 8, 2022

(54) CHALCOGEN-CONTAINING COMPOUND, ITS PREPARATION METHOD AND THERMOELECTRIC ELEMENT COMPRISING THE SAME

(71) Applicant: LG CHEM, LTD., Seoul (KR)

(72) Inventors: Minkyoung Kim, Daejeon (KR); Cheol Hee Park, Daejeon (KR); Chee Sung Park, Daejeon (KR); Myungjin Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 168 days.

(21) Appl. No.: 16/756,019

(22) PCT Filed: Aug. 23, 2019

(86) PCT No.: PCT/KR2019/010787
§ 371 (c)(1),
(2) Date: Apr. 14, 2020

(87) PCT Pub. No.: WO2020/040607
PCT Pub. Date: Feb. 27, 2020

(65) Prior Publication Data
US 2020/0295247 A1  Sep. 17, 2020

(30) Foreign Application Priority Data
Aug. 24, 2018  (KR) .......... 10-2018-0099493

(51) Int. Cl.
*H01L 35/16* (2006.01)
*C01B 19/00* (2006.01)
*C30B 29/46* (2006.01)

(52) U.S. Cl.
CPC ............ *H01L 35/16* (2013.01); *C01B 19/002* (2013.01); *C30B 29/46* (2013.01);
(Continued)

(58) Field of Classification Search
CPC ....... H01L 35/16; C01B 19/002; C30B 29/46; C01P 2002/52; C01P 2002/72;
(Continued)

(56) References Cited

U.S. PATENT DOCUMENTS 6,312,617 B1  11/2001  Kanatzidis et al.
2010/0051080 A1*  3/2010  Rhyee ............... C04B 35/547
136/239
(Continued)

FOREIGN PATENT DOCUMENTS

EP  1 930 960 A1  6/2008
JP  2011-528849 A  11/2011
(Continued)

OTHER PUBLICATIONS

Extended European Search Report for European Application No. 19851005.9, dated Jan. 11, 2021.
(Continued)

*Primary Examiner* — Andrew J. Oyer
(74) *Attorney, Agent, or Firm* — Birch, Stewart, Kolasch & Birch, LLP

(57) ABSTRACT

A chalcogen-containing compound of the following Chemical Formula 1, which may have decreased thermal conductivity and improved power factor in the low temperature region, and thus exhibit an excellent thermoelectric figure of merit, a method for preparing the same, and a thermoelectric element including the same:

$$V_1Sn_{a-x}In_xSb_2Te_{a+3} \quad \text{[Chemical Formula 1]}$$

wherein V, a and x are as defined in the specification.

15 Claims, 13 Drawing Sheets

(52) U.S. Cl.
CPC ...... *C01P 2002/52* (2013.01); *C01P 2002/72* (2013.01); *C01P 2002/76* (2013.01); *C01P 2002/77* (2013.01); *C01P 2002/78* (2013.01); *C01P 2006/32* (2013.01); *C01P 2006/40* (2013.01)

(58) Field of Classification Search
CPC .............. C01P 2002/76; C01P 2002/77; C01P 2002/78; C01P 2006/32; C01P 2006/40; C01P 2004/38
See application file for complete search history.

(56) References Cited

U.S. PATENT DOCUMENTS

2010/0139730 A1  6/2010  Bentien et al.
2014/0366924 A1  12/2014  Ren et al.

FOREIGN PATENT DOCUMENTS

| KR | 10-2010-0009521 A | 1/2010 |
| KR | 10-2011-0079490 A | 7/2011 |
| KR | 10-2017-0041540 A | 4/2017 |

OTHER PUBLICATIONS

Banik et al., "The origin of low thermal conductivity in $Sn_{1-x}Sb_xTe$: phonon scattering via layered intergrowth nanostructurest", Energy & Environmental Science, 2016, vol. 9, pp. 2011-2019.

Cheary et al., "A Fundamental Parameters Approach to X-ray Line-Profile Fitting", J. Appl. Crystallogr., 1992, vol. 25, pp. 109-121.

International Search Report (PCT/ISA/210) issued in PCT/KR2019/010787, dated Dec. 10, 2019.

Neudert et al., "Structural variations in indium tin tellurides and their thermoelectric properties", Manuscript for Journal of Solid State Chemistry, 2017, vol. 258, pp. 289-297. Total 17 pages.

Rosenthal et al., "Nanostructured rocksalt-type solid solution series $(Ge_{1-x}Sn_xTe)_nSb_2Te_3$ (n=4, 7, 12; 0 ≤x≤1 ): Thermal behavior and thermoelectrie properties", journal of Solid State Chemistry 2014, vol. 215, pp. 231-240.

Welzmiller et al., "Increasing Seebeck Coefficients and Thermoelectric Performance of Sn/Sb/Te arid Ge/Sb/Te Materials by Cd Doping", Adv. Electron. Mater., 2015, vol. 1, No. 1500266, pp. 1-12.

\* cited by examiner

CHALCOGEN-CONTAINING COMPOUND, ITS PREPARATION METHOD AND THERMOELECTRIC ELEMENT COMPRISING THE SAME

CROSS-REFERENCE TO RELATED APPLICATION

This application claims the benefit of Korean Patent Application No. 10-2018-0099493 filed on Aug. 24, 2018 with the Korean Intellectual Property Office, the disclosure of which is herein incorporated by reference in its entirety.

TECHNICAL FIELD

The present invention relates to a chalcogen-containing compound that exhibits excellent phase stability even in the driving temperature range of thermoelectric elements, and exhibits excellent thermoelectric properties as well as low thermal conductivity, a method for preparing the same, and a thermoelectric element including the same.

BACKGROUND ART

Recently, due to resource depletion and environmental problems caused by combustion, studies on thermoelectric conversion materials using waste heat as one of alternative energies has accelerated.

The energy conversion efficiency of such thermoelectric conversion material depends on a thermoelectric figure of merit (ZT). Here, ZT is determined according to a Seebeck coefficient, electrical conductivity, thermal conductivity, etc. as shown in the following Mathematical Formula 1, and more specifically, it is proportional to the square of a Seebeck coefficient and electrical conductivity, and is inversely proportional to thermal conductivity.

$$ZT = S^2 \sigma T/k \quad \text{[Mathematical Formula 1]}$$

(In Mathematical Formula 1, $\sigma$ is electrical conductivity, S is a Seebeck coefficient, k is thermal conductivity, and T is an absolute temperature)

Thus, in order to increase the energy conversion efficiency of a thermoelectric conversion element, the development of a thermoelectric conversion material having a high Seebeck coefficient (S) or electrical conductivity ($\sigma$) thus exhibiting high power factor (PF=$\sigma S^2$) or having low thermal conductivity (k) is required.

Among the various thermoelectric conversion materials known before, thermoelectric conversion materials with a crystal lattice structure related to or similar to sodium chloride (NaCl), in which a part of the lattice site is vacant, such as PbTe, $Bi_2Te_3$, SnSe, etc., for example, are known to exhibit excellent thermoelectric conversion properties. Materials having such a crystal lattice structure exhibit excellent electrical conductivity, and exhibit low thermal conductivity because a part of the lattice site becomes vacant. Thus, they may exhibit an excellent thermoelectric conversion property.

However, little is known about thermoelectric conversion materials that have a face-centered cubic lattice structure that is identical to sodium chloride as shown in FIG. 1, in which a part of the lattice site is vacant.

In general, as a crystal structure has higher symmetry, and the constructional atoms are heavies, the movement of the phonon is hindered, and thus thermal conductivity may be lowered, and in case a vacancy exists in a lattice, thermal conductivity may be further lowered.

Although $Sn_4Bi_2Se_7$ having a face-centered cubic lattice structure (or rock-salt structure) previously developed includes a vacancy in the lattice and thus has lowered thermal conductivity, it has a low power factor.

Thus, there is a demand for the development of a thermoelectric material capable of simultaneously realizing a high power factor resulting from a face-centered cubic lattice structure and low thermal conductivity resulting from the introduction of a vacancy.

DISCLOSURE

Technical Problem

Thus, it is an object of the present invention to provide a novel chalcogen-containing compound that has a high power factor in the medium to low temperature region of 100 to 300° C. as well as low thermal conductivity, and thus exhibits excellent thermoelectric properties, and a method for preparing the same.

It is another object of the present invention to provide a thermoelectric element including the above chalcogen-containing compound, thus exhibiting excellent thermoelectric properties.

Technical Solution

The present invention provides a chalcogen-containing compound represented by the following Chemical Formula 1:

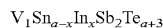  $V_1Sn_{a-x}In_xSb_2Te_{a+3}$ [Chemical Formula 1]

wherein, in Chemical Formula 1,

V is a vacancy, $14 = a \leq 16$, and $0 < x \leq 0.5$.

The present invention also provides a method for preparing the chalcogen-containing compound, including the steps of: mixing respective raw materials of Sn, Sb, Te, and In such that the mole ratio of Sn:Sb:Te:In becomes (a−x):2:(a+3):x (wherein $14 \leq a \leq 16$ and $0 < x \leq 0.5$), and subjecting the resultant mixture to a melting reaction; heat treating the resultant product obtained through the melting reaction; pulverizing the resultant product obtained through the heat treatment; and sintering the pulverized product.

The present invention also provides a thermoelectric element including the above chalcogen-containing compound as a thermoelectric conversion material.

The chalcogen-containing compound of Chemical Formula 1 according to one embodiment of the invention has a face-centered cubic lattice structure consisting of Sn, Sb, Te and In, but includes a vacancy (V), which is a vacant site among the lattice sites, thereby simultaneously realizing a high power factor due to the atomic connectivity of the face-centered cubic lattice structure, and low thermal conductivity due to the introduction of the vacancy. And, since In fills a part of the Sn sites, a power factor in the region of 100 to 400° C. may be improved and thermal conductivity may be decreased, while maintaining an excellent thermoelectric figure of merit (ZT).

Specifically, the chalcogen-containing compound of one embodiment has a vacancy, which is a vacant site excluding the sites filled with Sn, Sb, and Te, in the face-centered cubic lattice structure, and In fills a part of the Sn sites. More specifically, the Te fills the anionic sites of the face-centered cubic lattice structure, the Sn and Sb fill the cationic sites of the face-centered cubic lattice structure, a vacancy (V) is included in the vacant sites of cationic sites excluding the sites filled with the Sn and Sb, and In fills a part of the Sn. Herein, the substitution of In for Sn can be confirmed from the decrease in a lattice constant with the increase in the substitution amount of In metal.

FIG. 2 is a mimetic diagram showing the crystal structure of the chalcogen-containing compound according to one embodiment of the present invention. FIG. 2 is no more than one example to explain the present invention, and the present invention is not limited thereby.

Referring to FIG. 2, the chalcogen-containing compound of one embodiment basically has a face-centered cubic lattice structure identical to SnTe, but a vacancy (V) is introduced in the cationic site. Specifically, a vacancy (V), Sn, Sb, and In are randomly distributed at the site of (x, y, z)=(0, 0, 0), and Te is distributed at the site of (0.5, 0.5, 0.5). This can be confirmed from the Rietveld refinement results of the chalcogen compound powder calculated using the TOPAS program, as described in experimental examples below.

Specifically, the chalcogen-containing compound powder has a lattice constant of 6.2850 to 6.2900 Å, and Rwp (weighted pattern R) of 4.900 to 5.100, as calculated using the TOPAS program. And, as the substitution amount of In for Sn in the chalcogen-containing compound increases, a lattice constant decreases because the radius of $Sn^{2+}$ (118 pm) is larger than that of $In^{3+}$ (80 pm), and as the rate of [Sn]/[Sb] increases, a lattice constant increases because the radius of $Sn^{2+}$ (118 pm) is larger than that of $Sb^{3+}$ (76 pm). Thus, when a in Chemical Formula 1 is 14, the chalcogen-containing compound has a lattice constant of 6.2850 to 6.2860 Å, and Rwp of 5.900 to 5.990, and when a is 16, a lattice constant is 6.2880 to 6.2900 Å, and Rwp is 4.900 to 5.100.

A thermoelectric figure of merit is defined as $ZT=S^2\sigma T/k$ (S: Seebeck coefficient, σ: electrical conductivity, T: absolute temperature, and k: thermal conductivity), and the thermal conductivity of a chalcogen-containing compound results from the movement of the phonon, and may be lowered by hindering the movement of the phonon through the introduction of heavy element or a vacancy in the lattice. Thus, as proven in experimental examples below, due to the addition of In, the chalcogen-containing compound of Chemical Formula 1 has decreased hole charge concentration, and as a result, thermal conductivity to which charge carriers contribute may be decreased. Simultaneously, due to the existence of the vacancy, thermal conductivity may be further decreased. In addition, since the In additionally donates electrons together with Sn and Sb filling each cationic site, electrical conductivity decreases and a Seebeck coefficient increases, and thus a power factor, particularly a power factor (PF) in the medium to low temperature region of 100 to 300° C., is improved, and as a result, the thermoelectric figure of merit may increase.

In the chalcogen-containing compound of one embodiment, the In exhibits the effects of maintaining the power factor and improving the thermoelectric figure of merit due to a decrease in thermal conductivity.

Meanwhile, a vacancy (V) is a state wherein an atom of a lattice point is lost in a specific crystal lattice structure, and in the chalcogen-containing compound of one embodiment, the vacancy (V) performs a very important function for forming a face-centered cubic lattice structure identical to sodium chloride. If the vacancy (V) is completely filled with In, Sn, Sb and Te and removed, secondary phases having crystal structures other than a face-centered cubic lattice structure may be formed together, and thus properties such as electrical conductivity, etc. may be deteriorated, and application for a thermoelectric conversion material may be very limited. And, since the vacancy (V) facilitates the diffusion of atoms, heat treatment, deformation, precipitation, phase transformation, and the like may vary according to the existence of the vacancy. The chalcogen-containing compound of one embodiment may exhibit low lattice thermal conductivity due to phonon scattering of the vacancy, and thus may exhibit an excellent thermoelectric conversion property.

Further, in the chalcogen-containing compound, Sn, Sb, Te, and In are included at the mole ratio of (a−x):2:(a+3):x, and the mole ratio of (Sn+In):Sb:Te should fulfill the relationship of a:2:a+3. Since Sn bonds in the state of $Sn^{2+}$, Sb in the state of $Sb^{3+}$, and Te in the state of $Te^{2-}$, when they are included at the above described mole ratio, charge neutrality can be adjusted with $2a+(3\times2)-2(a+3)=0$.

In addition, a and x fulfill $14 \leq a \leq 16$ and $0 < x \leq 0.5$. When fulfilling the above requirements, a chalcogen-containing compound having a single phase of a face-centered cubic lattice structure is formed, and excellent thermoelectric properties may be exhibited.

If the content x of In is 0, since In metal does not exist in the chalcogen-containing compound, the improvement effect resulting from the substitution of the In metal for Sn cannot be obtained. And, if x exceeds 0.5, secondary phases having structures other than a face-centered cubic lattice structure may be formed, thus causing deterioration of thermoelectric properties. Considering the control of the x content and excellent thermoelectric property improvement effect resulting therefrom, $0 < x \leq 0.2$, $0.01 \leq x \leq 0.2$, or $0.1 \leq x \leq 0.2$.

Since the chalcogen-containing compound of Chemical Formula 1 includes a vacancy, and includes In that is substituted for a part of Sn, the problem in terms of a low power factor of the conventional thermoelectric material such as $Sn_4Bi_2Se_7$ and the like can be overcome, and a thermoelectric figure of merit can be significantly increased by the introduction of a vacancy and a decrease in thermal conductivity due to In, while maintaining an excellent power factor due to the face-centered cubic lattice structure. As a result, the chalcogen-containing compound of one embodiment can be very preferably used as a thermoelectric conversion material, in various fields and applications including various thermoelectric cooling systems or thermoelectric power generation systems, and the like.

Meanwhile, according to another embodiment of the present invention, a method for preparing the above-explained chalcogen-containing compound is provided.

Specifically, the method includes the steps of: mixing respective raw materials of Sn, Sb, Te, and In such that the mole ratio of Sn:Sb:Te:In becomes (a−x):2:(a+3):x, and subjecting the resultant mixture to a melting reaction (wherein $14 \leq a \leq 16$ and $0 < x \leq 0.5$); heat treating the resultant product obtained through the melting reaction; pulverizing the resultant product obtained through the heat treatment; and sintering the pulverized product.

In the preparation method, as the raw materials including Sn, Sb, Te, and In, for example, Sn, Sb, Te, and In powder or shot (non-angular particles) may be used. And, a powder such as $In_2Se$ may be used. In addition, if necessary, before mixing the above raw materials, a powderization process through grinding or milling may be selectively further conducted.

Further, the mixing of each raw material may be conducted by mixing each raw material at the mole ratio of Chemical Formula 1, specifically, at a ratio in which the mole ratio of Sn, Sb, Te, and In corresponds to (a−x):2:(a+

3):x, and then grinding or milling, and selectively pelletizing. Herein, a and x are as explained above. The resultant mixture may be in the state of a powder, pellets, ingots, and the like, according to the formation process.

Next, a melting process of the above prepared mixture is conducted.

During the melting process, reactions between the raw materials of metals are achieved, and the reaction product is obtained in the form of molten substance.

Specifically, the melting process may be conducted by charging the mixture into a quartz tube, and then heating it to a temperature of 700 to 900° C., more specifically 750 to 800° C., in a vacuum sealed state. Herein, in order to prevent a reaction between the raw materials and the quartz tube, the mixture may be put in a carbon crucible first, and then charged into the quartz tube.

After completing the melting process, in order to reduce a time of the subsequent heat treatment process, a cooling process of the prepared molten substance may be selectively further conducted.

The cooling process may include cooling with a medium, and any cooling methods used in the field of thermoelectric materials may be applied without limitations. For example, it may be conducted by natural cooling or cold air cooling, and may be conducted until the temperature of molten substance becomes a room temperature level (23±5° C.).

Next, for the molten substance obtained as the result of the melting process, a heat treatment process is conducted.

The heat treatment is a process for forming a single phase of a face-centered cubic lattice structure, and specifically, it may be conducted at a temperature of 550 to 640° C., more specifically 600 to 640° C., for 24 to 72 hours. The heat treatment may be progressed in a furnace such as an electric furnace, etc., and it may be progressed under vacuum or an inert gas atmosphere. In addition, the heat treatment may be progressed in a single step, or it may be divided into two or more steps and progressed.

Next, after the heat treatment, the heat treated product is pulverized.

The pulverizing process may be progressed using a previously known method and apparatus for preparing a thermoelectric conversion material, and through the pulverizing step, a powder product may be obtained.

Meanwhile, between the heat treatment step and the pulverizing step, a step of cooling the product of the heat treatment step to form an ingot may be further progressed.

Here, the cooling process may be progressed using various cooling media, and any cooling devices and methods previously used in the preparation process of thermoelectric conversion material may be used without specific limitations. After forming an ingot through the cooling step, the ingot may be pulverized.

After the pulverizing step, the pulverized product may be sintered. By progressing the sintering step, a chalcogen-containing compound of the above explained embodiment may be prepared in the form of a sintered body. Such a sintering step may be progressed by spark plasma sintering, etc. that are well known to a person having ordinary knowledge.

The sintering step may be progressed at a temperature of 550 to 640° C. and a pressure of 10 to 100 MPa, more specifically, at a temperature of 600 to 640° C. under a pressure of 30 to 100 MPa, for 5 to 10 minutes.

After progressing the sintering, optionally, a cooling step may be further progressed, and the cooling process may be conducted by a common method as explained above.

Since the above-explained steps may be progressed while applying common preparation conditions, methods, and apparatuses for forming a metal compound such as a chalcogen compound or a thermoelectric conversion material, and specific reaction conditions and methods are described in the examples below, additional explanations thereof are omitted.

According to yet another embodiment of the present invention, a thermoelectric element including the chalcogen-containing compound of the above embodiment as a thermoelectric conversion material is provided. Such a thermoelectric element may include the chalcogen-containing compound of the above embodiment (thermoelectric conversion material) as a p-type or an n-type thermoelectric conversion material, and for this, it may include a compound additionally doped with an additional p-type or n-type element as a thermoelectric conversion material. The kind of the p-type element or n-type element or doping method that can be used is not specifically limited, and elements and doping methods commonly used to apply a thermoelectric conversion material as a p-type or n-type may be used.

The thermoelectric element may include a thermoelectric element formed by processing and molding a p-type or n-type thermoelectric conversion material obtained in the form of a sintered body, and it may include an insulation substrate and an electrode for the combination structure of the thermoelectric element, insulation substrate, and electrode, and the structure of a common thermoelectric element may be applied.

Further, as the insulation substrate, a sapphire substrate, a silicon substrate, a Pyrex substrate, a quartz substrate, etc. may be used, and as the electrode, any electrode including metals or conductive metal compounds may be used.

Since the above-explained thermoelectric element includes the thermoelectric conversion material of one embodiment, it may exhibit an excellent thermoelectric conversion property, and may be preferably applied as a thermoelectric cooling system or thermoelectric generation system, etc. in various fields and uses.

Effect of the Invention

According to the present invention, a novel chalcogen-containing compound that exhibits an excellent thermoelectric figure of merit (ZT) due to improvement in power factor in the low temperature region and a decrease in thermal conductivity, and a method for preparing the same, are provided. By applying such a chalcogen-containing compound, a thermoelectric element exhibiting excellent thermoelectric properties may be provided.

BEST MODE FOR CARRYING OUT THE INVENTION

Figure 1:
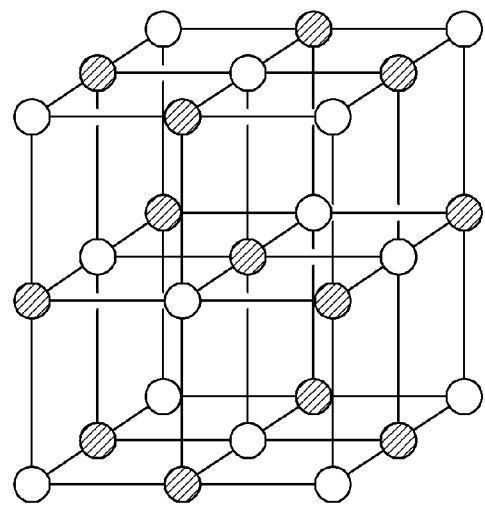
FIG. 1 is a mimetic diagram showing a face-centered cubic lattice structure.

The present invention will be explained in more detail in the following examples. However, these examples are presented only as the illustrations of the present invention, and the scope of the present invention is not limited thereby.

Comparative Example 1: Preparation of a Chalcogen-Containing Compound of $V_1Sn_{14}Sb_2Te_{17}$ High purity raw materials Sn shot, Sb shot, and Te shot were weighed in a glovebox at a mole ratio of 14:2:17, put in a carbon crucible, and then charged into a quartz tube. The inside of the quartz tube was vacuumized and sealed. Subsequently, the raw materials were maintained at a constant temperature in an electric furnace at 750 for hours, and then slowly cooled to room temperature. Thereafter, they were heat treated at 640 for 48 hours, and the quartz tube in which the reaction was progressed was cooled with water to obtain an ingot. The ingot was finely pulverized to powder with a particle diameter of 75 μm or less, and sintered by spark plasma sintering (SPS) at a temperature of 600 and a pressure of 50 MPa for 8 minutes, thus preparing a chalcogen-containing compound.

Comparative Example 2: Preparation of a Chalcogen-Containing Compound of $V_1Sn_{16}Sb_2Te_{19}$ High purity raw materials Sn shot, Sb shot, and Te shot were weighed in a glovebox at a mole ratio of 16:2:19, put in a carbon crucible, and then charged into a quartz tube. The inside of the quartz tube was vacuumized and sealed. The raw materials were maintained at a constant temperature in an electric furnace at 750 for 12 hours, and then slowly cooled to room temperature. Thereafter, they were heat treated at 640° C. for 48 hours, and the quartz tube in which a reaction was progressed was cooled with water to obtain an ingot. The ingot was finely pulverized to powder with a particle diameter of 75 μm or less, and sintered by spark plasma sintering (SPS) at a temperature of 600° C. and a pressure of 50 MPa for 8 minutes, thus preparing a chalcogen-containing compound.

Comparative Example 3: Preparation of a Chalcogen-Containing Compound of $V_1Sn_{13.2}In_{0.8}Sb_2Te_{17}$ High purity raw materials Sn shot, In powder, Sb shot, and Te shot were weighed in a glovebox at a mole ratio of 13.2:0.8:2:17, put in a carbon crucible, and then charged into a quartz tube. The inside of the quartz tube was vacuumized and sealed. Subsequently, the raw materials were maintained at a constant temperature in an electric furnace at 750 for 12 hours, and then slowly cooled to room temperature. Thereafter, they were heat treated at 640° C. for 48 hours, and the quartz tube in which a reaction was progressed was cooled with water to obtain an ingot. The ingot was finely pulverized to powder with a particle diameter of 75 μm or less, and sintered by spark plasma sintering (SPS) at a temperature of 600° C. and a pressure of 50 MPa for 8 minutes, thus preparing a chalcogen-containing compound.

Comparative Example 4: Preparation of a Chalcogen-Containing Compound of $V_1Sn_{10}In_2Te_{13}$ High purity raw materials Sn shot, In powder, and Te shot were weighed in a glovebox at a mole ratio of 10:2:13, put in a carbon crucible, and then charged into a quartz tube. The inside of the quartz tube was vacuumized and sealed. Subsequently, the raw materials were maintained at a constant temperature in an electric furnace at 750 for hours, and then slowly cooled to room temperature. Thereafter, they were heat treated at 640 for 48 hours, and the quartz tube in which a reaction was progressed was cooled with water to obtain an ingot. The ingot was finely pulverized to powder with a particle diameter of 75 μm or less, and sintered by spark plasma sintering (SPS) at a temperature of 600° C. and a pressure of 50 MPa for 8 minutes, thus preparing a chalcogen-containing compound.

Comparative Example 5: Preparation of a Chalcogen-Containing Compound of $V_1Sn_{10}Sb_2Te_{13}$ High purity raw materials Sn shot, Sb shot, and Te shot were weighed in a glovebox at a mole ratio of 10:2:13, put in a carbon crucible, and then charged into a quartz tube. The inside of the quartz tube was vacuumized and sealed. Subsequently, the raw materials were maintained at a constant temperature in an electric furnace at 750° C. for 12 hours, and then slowly cooled to room temperature. Thereafter, they were heat treated at 640° C. for 48 hours, and the quartz tube in which a reaction was progressed was cooled with water to obtain an ingot. The ingot was finely pulverized to powder with a particle diameter of 75 μm or less, and sintered by spark plasma sintering (SPS) at a temperature of 600° C. and a pressure of 50 MPa for 8 minutes, thus preparing a chalcogen-containing compound.

Comparative Example 6: Preparation of a Chalcogen-Containing Compound of $V_{0.7}Sn_{13.9}In_{0.4}Sb_2Te_{17}$ High purity raw materials Sn shot, In powder, Sb shot, and Te shot were weighed in a glovebox at a mole ratio of 13.9:0.4:2:17, put in a carbon crucible, and then charged into a quartz tube. The inside of the quartz tube was vacuumized and sealed. Subsequently, the raw materials were maintained at a constant temperature in an electric furnace at 750 for 12 hours, and then slowly cooled to room temperature. Thereafter, they were heat treated at 640° C. for 48 hours, and the quartz tube in which a reaction was progressed was cooled with water to obtain an ingot. The ingot was finely pulverized to powder with a particle diameter of 75 μm or less, and sintered by spark plasma sintering (SPS) at a temperature of 600 and a pressure of 50 MPa for 8 minutes, thus preparing a chalcogen-containing compound.

Comparative Example 7: Preparation of a Chalcogen-Containing Compound of $V_1Sn_{13.9}Fe_{0.1}Sb_2Te_{17}$ High purity raw materials Sn shot, Fe powder, Sb shot, and Te shot were weighed in a glovebox at a mole ratio of 13.9:0.1:2:17, put in a carbon crucible, and then charged into a quartz tube. The inside of the quartz tube was vacuumized and sealed. Subsequently, the raw materials were maintained at a constant temperature in an electric furnace at 750 for 12 hours, and then slowly cooled to room temperature. Thereafter, they were heat treated at 640° C. for 48 hours, and the quartz tube in which a reaction was progressed was cooled with water to obtain an ingot. The ingot was finely pulverized to powder with a particle diameter of 75 μm or less, and sintered by spark plasma sintering (SPS) at a temperature of 600° C. and a pressure of 50 MPa for 8 minutes, thus preparing a chalcogen-containing compound.

Example 1: Preparation of a Chalcogen-Containing Compound of $V_1Sn_{13.9}In_{0.1}Sb_2Te_{17}$ A chalcogen-containing compound was prepared by the same method as Comparative Example 1, except that high purity raw materials of Sn shot, In powder, Sb shot, and Te shot were used at the mole ratio of 13.9:0.1:2:17.

Example 2: Preparation of a Chalcogen-Containing Compound of $V_1Sn_{13.8}In_{0.2}Sb_2Te_{17}$ A chalcogen-containing compound was prepared by the same method as Comparative Example 1, except that high purity raw materials of Sn shot, In powder, Sb shot, and Te shot were used at the mole ratio of 13.8:0.2:2:17.

Example 3: Preparation of a Chalcogen-Containing Compound of $V_1Sn_{15.9}In_{0.1}Sb_2Te_{19}$ A chalcogen-containing compound was prepared by the same method as Comparative Example 1, except that high purity raw materials of Sn shot, In powder, Sb shot, and Te shot were used at the mole ratio of 15.9:0.1:2:19.

Example 4: Preparation of a Chalcogen-Containing Compound of $V_1Sn_{15.8}In_{0.2}Sb_2Te_{19}$ A chalcogen-containing compound was prepared by the same method as Comparative Example 1, except that high purity raw materials of Sn shot, In powder, Sb shot, and Te shot were used at the mole ratio of 15.8:0.2:2:19.

Experimental Examples

1. Phase Analysis According to XRD Pattern

Figure 3:
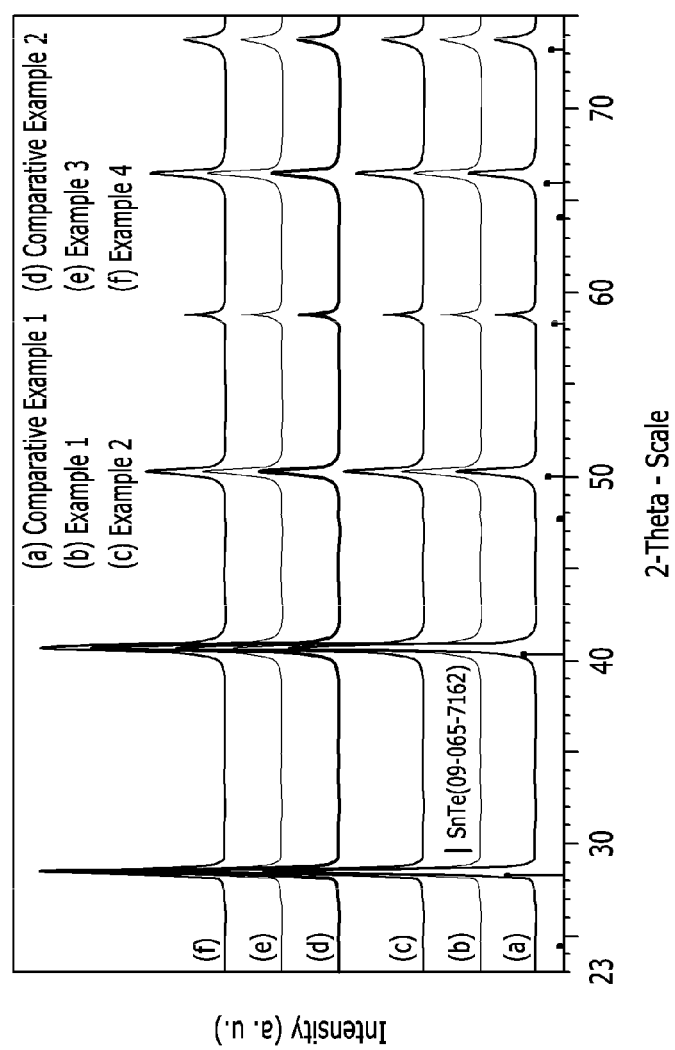
FIG. 3 shows X-ray diffraction (XRD) analysis results of chalcogen compound powders prepared in Examples 1 to 4 and Comparative Examples 1 and 2.

For the powder chalcogen-containing compound powders prepared in Examples 1 to 4 and Comparative Examples 1 and 2, X-ray diffraction analysis was progressed under the following conditions, and the results are shown in FIG. 3. In the same manner, for the powder chalcogen-containing compound powders prepared in Comparative Examples 3 to 7, X-ray diffraction analysis was progressed and the results are shown in FIG. 4.

For the X-ray diffraction analysis, each chalcogen-containing compound prepared in the examples and comparative examples was properly pulverized and charged into the sample holder of an X-ray diffraction analyzer (Bruker D8-Advance XRD), and X-ray scanned at an interval of 0.02 degrees, with Cu Kα1 (λ=1.5405 Å), an applied voltage of 40 kV, and an applied current of 40 mA.

As shown in FIG. 3, it was confirmed that the chalcogen compounds of Examples 1 to 4 and Comparative Examples 1 and 2 have lattice structures identical to SnTe, which was previously known to have a face-centered cubic lattice structure.

Figure 4:
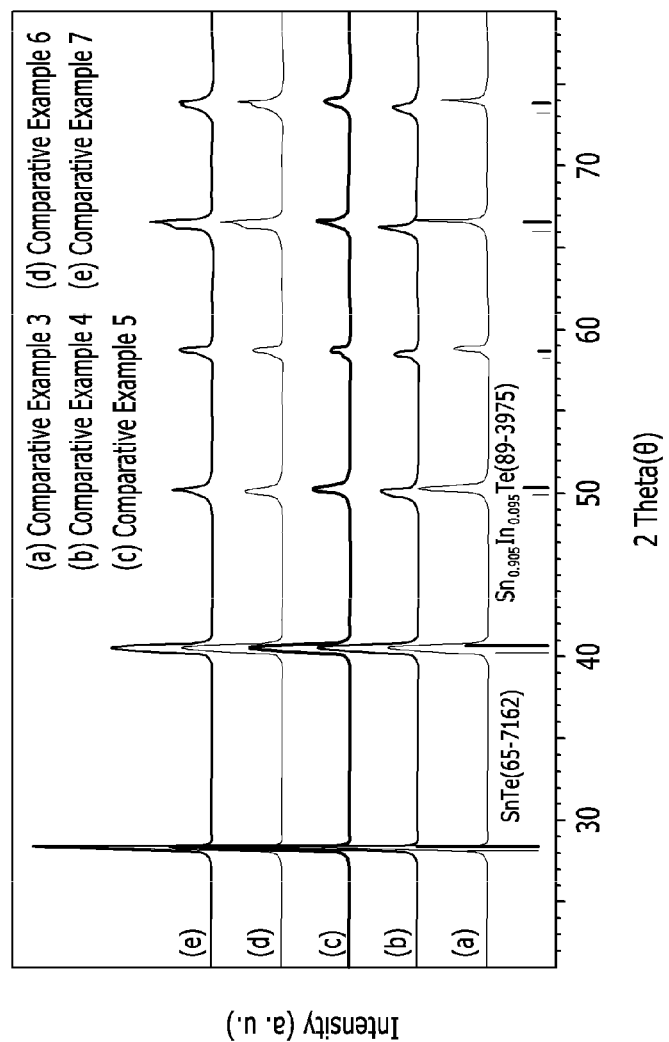
FIG. 4 shows the X-ray diffraction analysis results of chalcogen compound powders prepared in Comparative Examples 3 to 7.

Meanwhile, as shown in FIG. 4, it was confirmed that the chalcogen-containing compound of Comparative Example 4 including In instead of Sb, and the chalcogen-containing compound of Comparative Example 5 without In substitution, also have the same lattices structure as SnTe. However, it was confirmed that although the chalcogen compounds of Comparative Example 3 wherein In is excessively substituted, Comparative Example 6 wherein Sn, In, Sb, Te, and vacancy (V) are included, but the content of the vacancy is less than 1, and Comparative Example 7 wherein a part of Sn is substituted with Fe instead of In, have lattice structures similar to that of SnTe, a composition wherein In is substituted at the Sn site ($Sn_{0.905}In_{0.095}Te$) is mixed. Thus, in the case of Comparative Examples 6 and 7, due to the existence of a secondary phase having a different composition, it is expected that the thermoelectric figure of merit may be deteriorated, compared to the examples.

From the above results, it can be seen that under conditions fulfilling the mole ratio of Sn:Te of (a-x):(a+3) (wherein 14≤a≤16 and 0<x≤0.5), in case a vacancy is included, and a part of Sn is substituted with In, a stable face-centered cubic lattice structure may be formed without formation of secondary phases.

2. Analysis of Crystal Structure Using TOPAS Program

Using a TOPAS program (R. W. Cheary, A. Coelho, J. Appl. Crystallogr. 25 (1992) 109-121; Bruker AXS, TOPAS 4.2, Karlsruhe, Germany (2009)), the lattice constant (lattice parameter) of each powder chalcogen-containing compound of Examples 1 to 4 and Comparative Examples 1 and 2 was calculated, and the results are shown in the following Table 1. Further, the Rietveld refinement results of the chalcogen-containing compounds of Examples 1 to 4 and Comparative Examples 1 and 2, calculated using the TOPAS program, are shown in the following Table 2.

TABLE 1

| | Lattice constant (Lattice parameter) (Å) | Calculated Vacancy concentration |
|---|---|---|
| Comparative Example 1 | 6.2872 | 1/17 (0.059) |
| Example 1 | 6.2861 | |
| Example 2 | 6.2853 | |
| Comparative Example 2 | 6.2899 | 1/19 (0.053) |

TABLE 1-continued

| | Lattice constant (Lattice parameter) (Å) | Calculated Vacancy concentration |
|---|---|---|
| Example 3 | 6.2897 | |
| Example 4 | 6.2886 | |

TABLE 2

| Unit (atomic %) | Comparative Example 1 | Example 1 | Example 2 | Comparative Example 2 | Example 3 | Example 4 |
|---|---|---|---|---|---|---|
| Vacancy (0, 0, 0) occupancy | 0.0589 | 0.0589 | 0.0589 | 0.0526 | 0.0526 | 0.0526 |
| Sn (0, 0, 0) occupancy | 0.8235 | 0.8176 | 0.8118 | 0.8421 | 0.8368 | 0.8316 |
| In (0, 0, 0) occupancy | 0 | 0.0059 | 0.0118 | 0 | 0.0053 | 0.0105 |
| Sb (0, 0, 0) occupancy | 0.1176 | 0.1176 | 0.1176 | 0.1053 | 0.1053 | 0.1053 |
| Te (0.5, 0.5, 0.5) occupancy | 1 | 1 | 1 | 1 | 1 | 1 |
| Rwp (weighted pattern R) | 5.096 | 5.976 | 5.935 | 5.373 | 4.916 | 5.016 |

Figure 2:
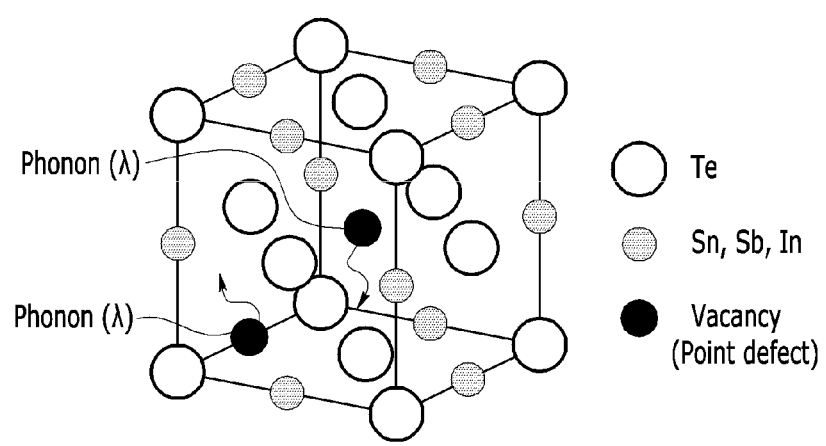
FIG. 2 is a mimetic diagram showing the lattice structure of the chalcogen-containing compound according to one embodiment of the present invention.

Examining the schemes of the chalcogen-containing compounds with reference to the Tables 1 and 2, and FIG. 2, in the chalcogen-containing compounds of Examples 1 to 4, V (vacancy), Sn, Sb, and In are randomly distributed at the (x, y, z)=(0, 0, 0) site, and Te is distributed at the (0.5, 0.5, 0.5) site. As shown in Table 1, this corresponds to the Rietveld refinement results calculated using the TOPAS program, and the calculated composition is very similar to the initial nominal composition. Thus, it can be seen that in the chalcogen-containing compounds of Examples 1 to 4, a vacancy (V) is included, and a part of Sn is substituted with In, and thus the concentration of Sn decreases.

Referring to Table 1, as the content (x) of In in the face-centered cubic lattice structure increases, a lattice constant gradually decreases (Comparative Example 1>Example 1>Example 2), (Comparative Example 2>Example 3>Example 4). This means that since the radius of $Sn^{2+}$ (118 pm) is larger than that of $In^{3+}$ (80 pm), as the content of In increases, that is, as the substitution amount of In for Sn increases, the lattice constant decreases.

It can also be confirmed that in case the rate of [Sn]/[Sb] increases, the lattice constant increases because the radius of $Sn^{2+}$ (118 pm) is larger than that of $Sb^{3+}$ (76 pm) (Comparative Example 2>Comparative Example 1), (Example 3>Example 1), (Example 4>Example 2).

2. Temperature Dependency of Electrical Conductivity

Figure 5:
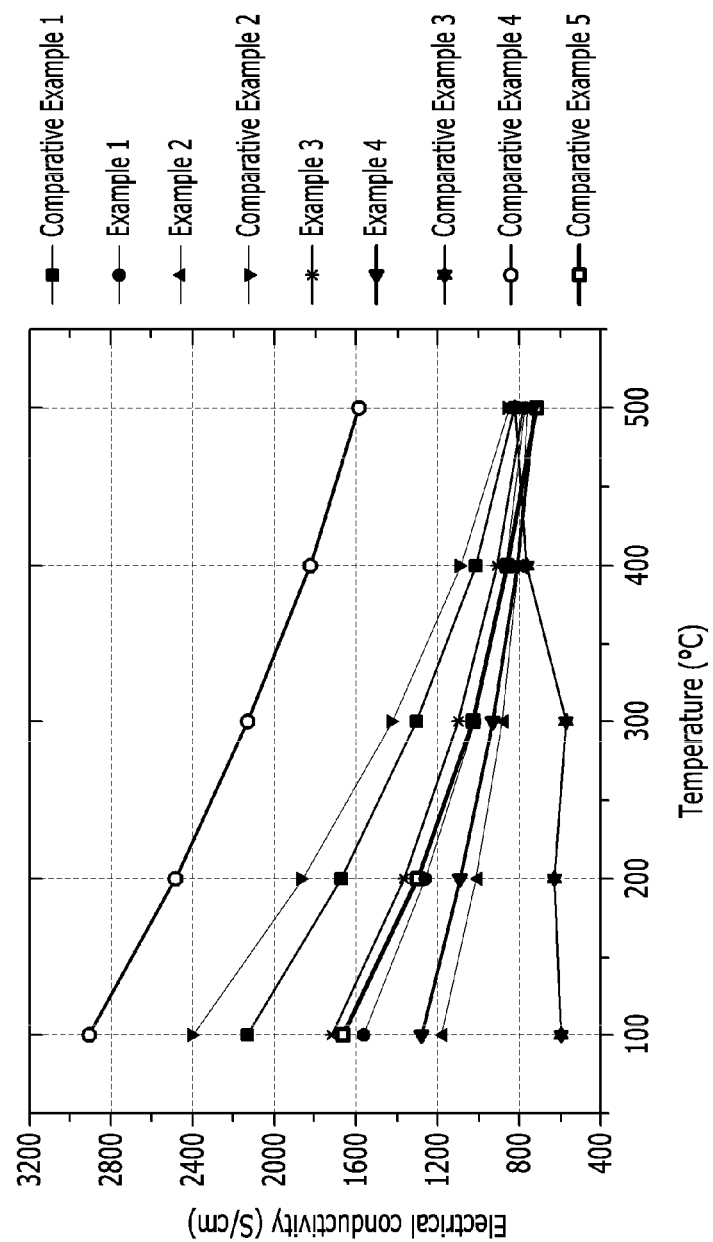
FIG. 5 is a graph showing the results of measuring electrical conductivities of the chalcogen compounds of Examples 1 to 4 and Comparative Examples 1 to 5 according to temperature.

For the chalcogen-containing compound specimens prepared in Examples 1 to 4 and Comparative Examples 1 to 5, electrical conductivities were measured according to temperature change and are shown in FIG. 5. The electrical conductivity was measured in the temperature range of 100 to 500° C. through a four-probe direct current method, using a resistivity meter ZEM-3 from ULVAC.

Referring to FIG. 5, in the case of Comparative Examples 1 and 2, as the content of Sn increases, electrical conductivity increases. The reason is that Sn donates one less electron compared to Sb ($Sn^{2+}$ vs. $Sb^{3+}$), and thus, as the content of Sn increases, the number of donated electrons decreases, and to the contrary, the concentration of main charge carrier holes increases.

Further, in the case of Comparative Example 3, In is substituted at the Sn site to fill the intrinsic vacancy of Sn, thus decreasing the hole concentration, and remaining In acts as $In^{3+}$ to increase the number of donated electrons, thereby additionally decreasing the concentration of main charge carrier holes. As a result, electrical conductivity rapidly decreased. Further, the chalcogen-containing compound of Comparative Example 3 exhibits the properties of a semiconductor with a tendency of an increase in electrical conductivity according to an increase in measurement temperature, unlike Comparative Examples 1 and 2 and Examples 1 to 4.

In addition, Comparative Example 4 includes In without including Sb, unlike Comparative Example 5, and due to the low atomic number of In compared to Sb, the number of donated electrons deceases, and to the contrary, the concentration of main charge carrier holes increases, thus exhibiting high electrical conductivity compared to Comparative Example 5.

Meanwhile, comparing Examples 1 and 2 with Comparative Example 1, and Examples 3 and 4 with Comparative Example 2, as the Sn site is substituted with In, the intrinsic vacancy of Sn is filled to decrease the concentration of holes, and thus, electrical conductivity relatively decreases.

3. Temperature Dependency of Seebeck Coefficient

Figure 6:
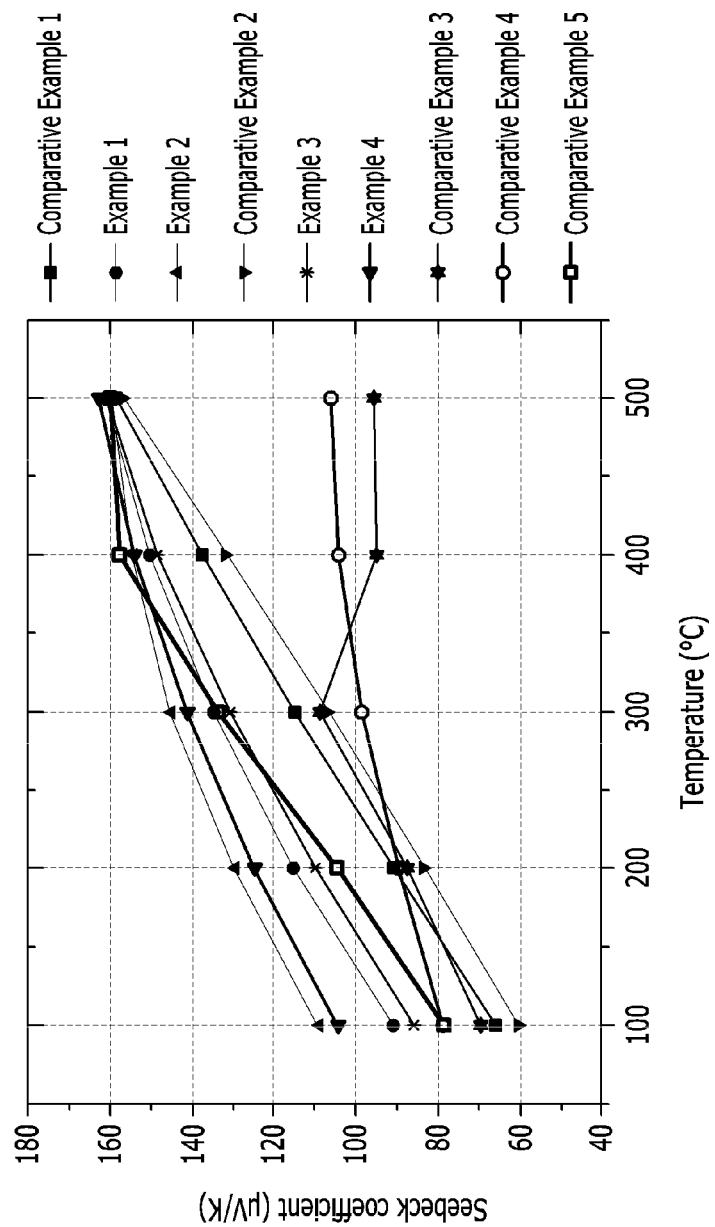
FIG. 6 is a graph showing the results of measuring Seebeck coefficients of the chalcogen compounds of Examples 1 to 4 and Comparative Examples 1 to 5 according to temperature.

For the chalcogen-containing compound specimens prepared in Examples 1 to 4 and Comparative Examples 1 to 5, Seebeck coefficients (S) were measured according to temperature change, and the results are shown in FIG. 6. The Seebeck coefficient was measured in the temperature range of 100 to 500° C. by a differential voltage/temperature technique, using measuring equipment of ZEM-3 from ULCAC.

As shown in FIG. 6, Examples 1 to 4 and Comparative Examples 1 to 5 exhibit positive (+) Seebeck coefficients, and thus it can be seen that the major electric charge carriers of the materials are holes, thus exhibiting the properties as P-type semiconductor materials.

Comparative Examples 1 and 2 showed a tendency of a decrease in the Seebeck coefficient according to an increase in the Sn content.

Meanwhile, Comparative Example 1 and Examples 1 and 2 showed a tendency of an increase in the Seebeck coefficient according to the substitution of In at the Sn site. Similarly, Comparative Example 2 and Examples 3 and 4 showed a tendency of an increase in the Seebeck coefficient according to the substitution of In at the Sn site. The reason is that the Seebeck coefficient has an opposite tendency to electrical conductivity in terms of a charge carrier concentration (as the concentration of charge carriers is higher, electrical conductivity increases but the Seebeck coefficient decreases).

Further, since Comparative Example 3 shows the electrical conductivity properties of a semiconductor as confirmed in FIG. 5, it showed a different tendency from the Seebeck coefficient change tendencies of Comparative Examples 1 and 2 and Examples 1 to 4, and Comparative Example 4 showed a low Seebeck coefficient due to high electrical conductivity.

4. Temperature Dependency of Power Factor

Figure 7:
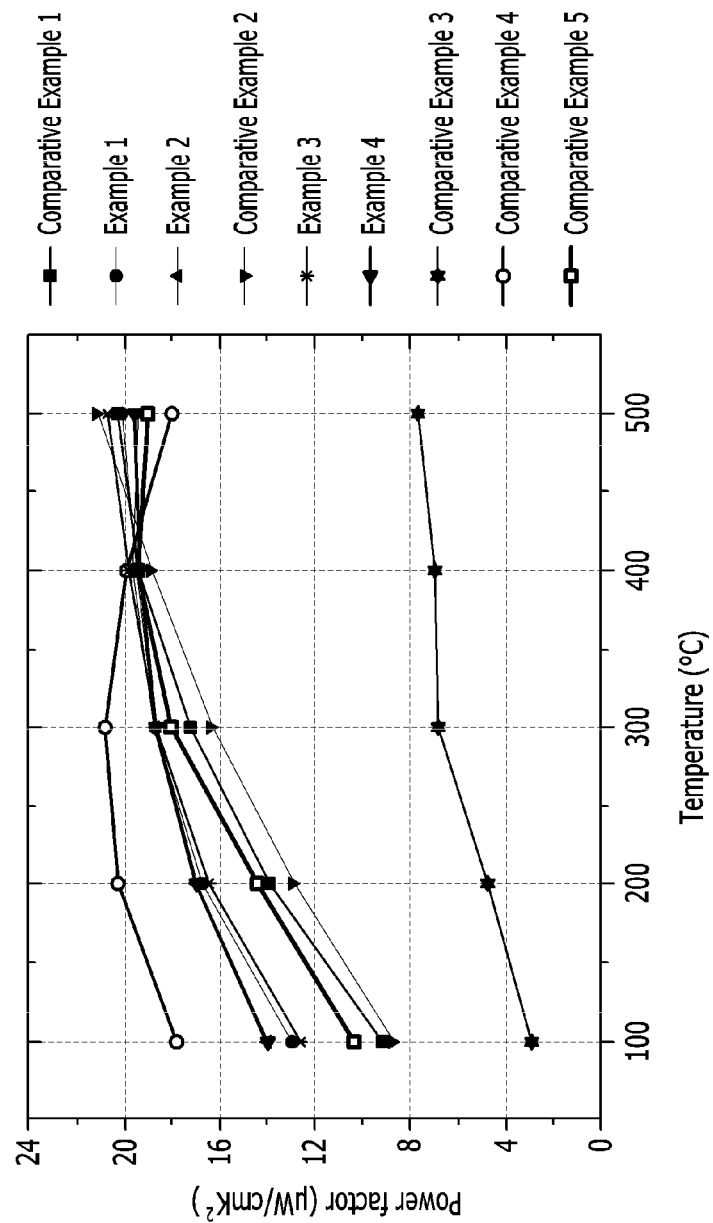
FIG. 7 is a graph showing the results of measuring power factors of the chalcogen compounds of Examples 1 to 4 and Comparative Examples 1 to 5 according to temperature.

For the chalcogen-containing compound specimens prepared in Examples 1 to 4 and Comparative Examples 1 to 5, power factors were calculated according to temperature change, and the results are shown in FIG. 7.

The power factor is defined as Power Factor $(PF)=\sigma S^2$, and it was calculated using the values of $\sigma$ (electric conductivity) and S (Seebeck coefficient) shown in FIGS. 5 and 6.

As shown in FIG. 7, it was confirmed that Comparative Examples 1 and 2 showed a low power factor at a low temperature region, but the power factor tends to increase toward a high temperature region.

And, Comparative Example 3 showed a low power factor due to low electrical conductivity and low Seebeck coefficient. Comparative Example 4 showed a high power factor due to high electrical conductivity despite a low Seebeck coefficient, but the power factor tended to decrease as a measurement temperature increases.

5. Temperature Dependency of Thermal Conductivity

Figure 8:
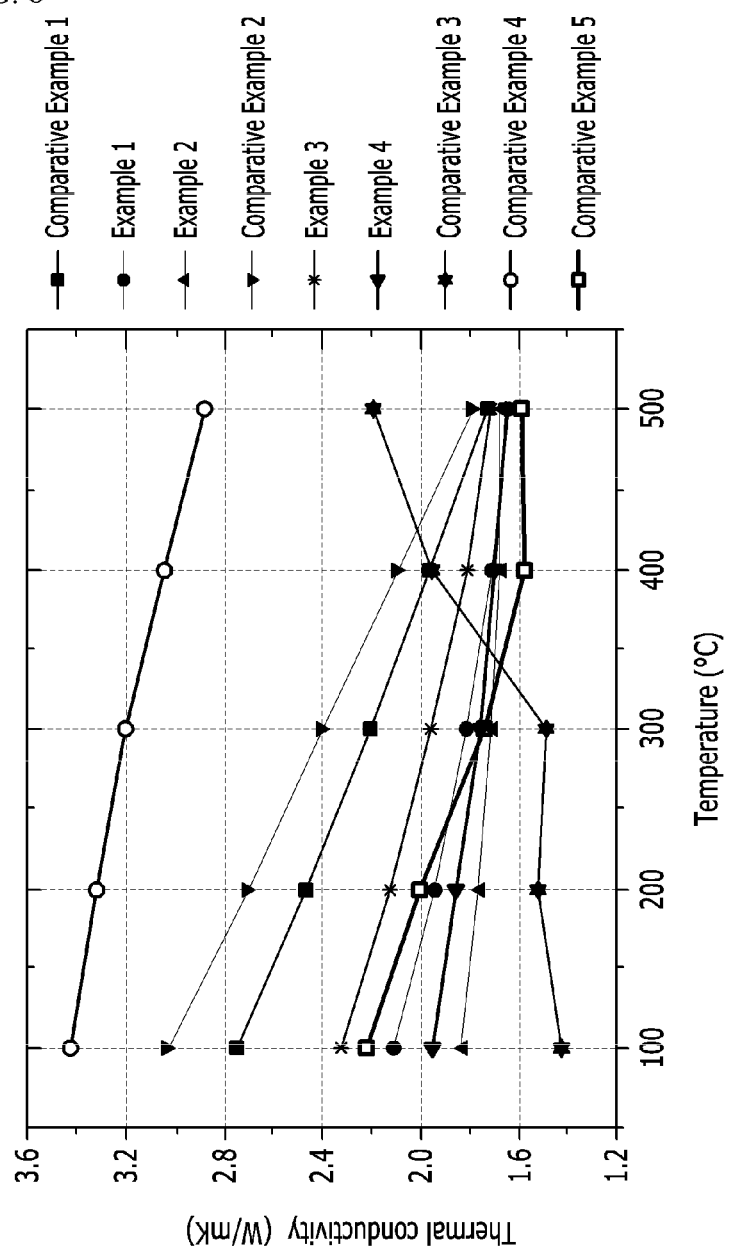
FIG. 8 is a graph showing the results of measuring total thermal conductivities of the chalcogen compounds of Examples 1 to 4 and Comparative Examples 1 to 5 according to temperature.

For the chalcogen-containing compound specimens prepared in Examples 1 to 4 and Comparative Examples 1 to 5, thermal conductivities were measured according to temperature change, and the results are shown in FIG. 8.

Specifically, for the measurement of thermal conductivity, thermal diffusivity (D) and heat capacity ($C_p$) were measured by a laser flash method, using thermal conductivity measuring equipment of LFA457 from Netzsch Company, and the measured values were applied in the following Mathematical Formula 2 to calculate thermal conductivity (k).

Thermal conductivity $(k)=D\rho C_p$     [Mathematical Formula 2]

In Mathematical Formula 2, D is thermal diffusivity, $C_p$ is heat capacity, and p is the density of a sample measured by Archimedes's principle.

And, total thermal conductivity $(k=k_L+k_E)$ is divided into lattice thermal conductivity $(k_L)$ and thermal conductivity $(k_E)$ calculated according to Wiedemann-Franz law $(k_E=L\sigma T)$, wherein, as the Lorentz number (L), a value calculated from the Seebeck coefficient according to temperature was used.

Referring to FIG. 8, it was confirmed that in Comparative Examples 1 and 2, as the content of Sn increases, total thermal conductivity increases due to an increase in charge concentration, but Examples 1 to 4 showed relatively low thermal conductivity compared to Comparative Examples 1 and 2. This means that according to In substitution, hole charge concentration decreased, and thus thermal conductivity to which charge carrier contributes decreased. It has the same tendency as the electrical conductivity of FIG. 5.

6. Temperature Dependency of Thermoelectric Figure of Merit (ZT)

Figure 9:
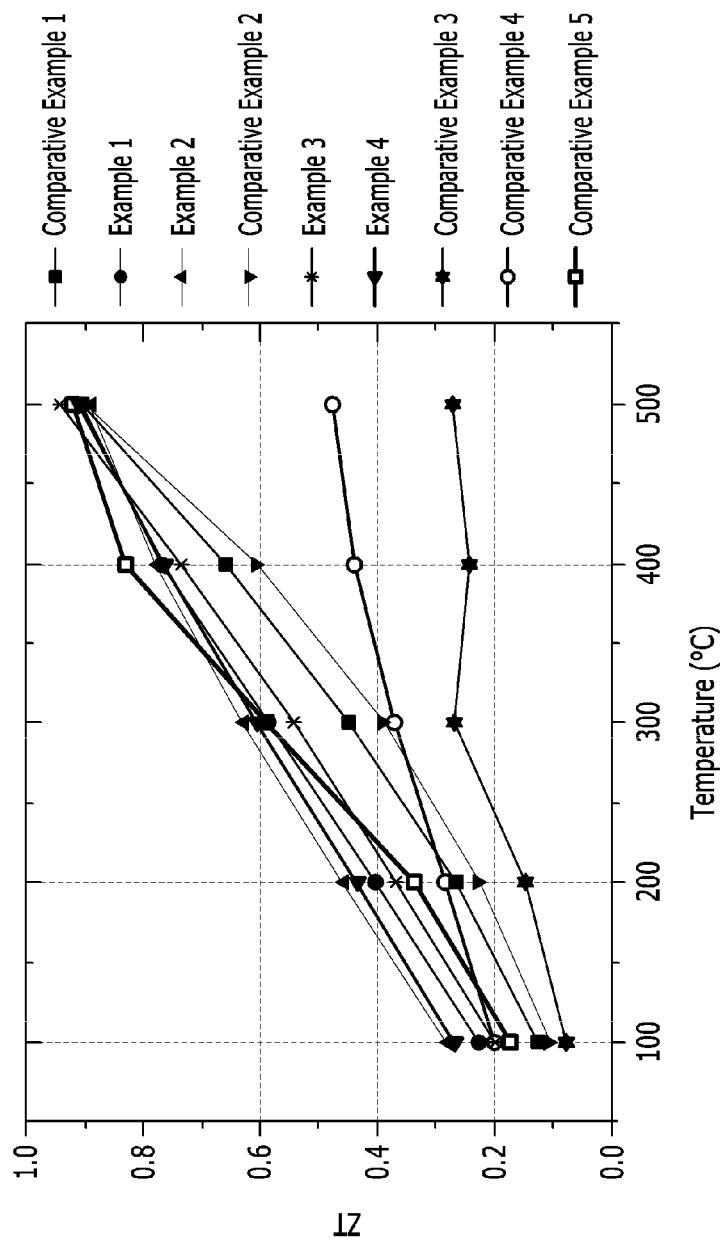
FIG. 9 is a graph showing the thermoelectric figures of merit of the chalcogen compounds of Examples 1 to 4 and Comparative Examples 1 to 5 according to temperature.

For the chalcogen-containing compound specimens prepared in Examples 1 to 4 and Comparative Examples 1 to 5, the thermoelectric figure of merit was calculated according to temperature change, and the results are shown in FIG. 9.

The thermoelectric figure of merit is defined by $ZT=S^2\sigma T/k$, and it was calculated using the S (Seebeck coefficient), $\sigma$ (electric conductivity), T (absolute temperature), and k (thermal conductivity) values obtained in experimental examples.

Referring to FIG. 9, Comparative Examples 1 and 2 showed low ZT in the low temperature region due to the increased Sn content, but ZT increased toward a high temperature region, while Examples 1 to 4 showed relatively high ZT from the low temperature region as the Sn site is substituted with In, and showed similar or slightly higher ZT in the high temperature region. Particularly, Example 3 showed high ZT of about 0.94 (at 500° C.).

7. Average Thermoelectric Properties

Based on the above experimental results, average power factor ($PF_{average}$), average thermal conductivity ($K_{tot,average}$), and average thermoelectric figure of merit ($ZT_{average}$) at 100 to 500° C. were calculated. The results are shown in the following Table 3 and FIGS. 10 to 13.

Figure 10:
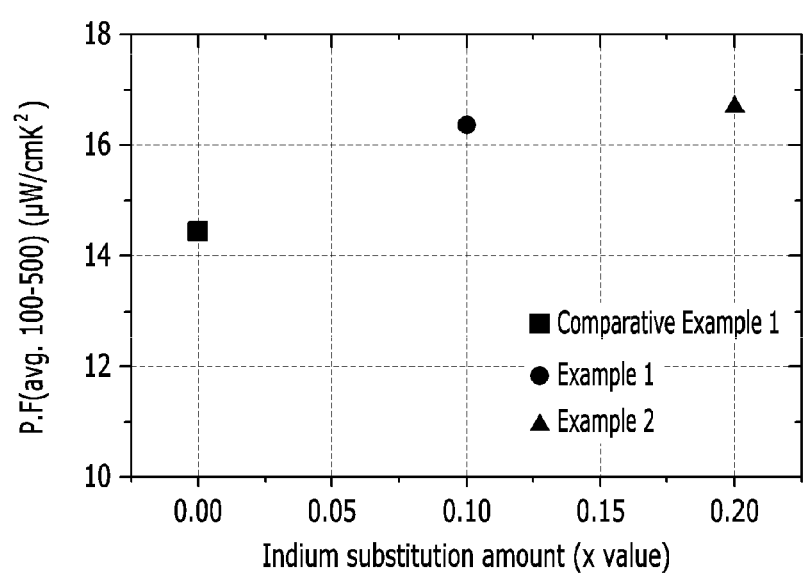
FIG. 10 is a graph showing the average power factors according to an indium substitution amount in the chalcogen-containing compounds of Examples 1 and 2 and Comparative Example 1 (temperature region: 100~500° C.).
Figure 11:
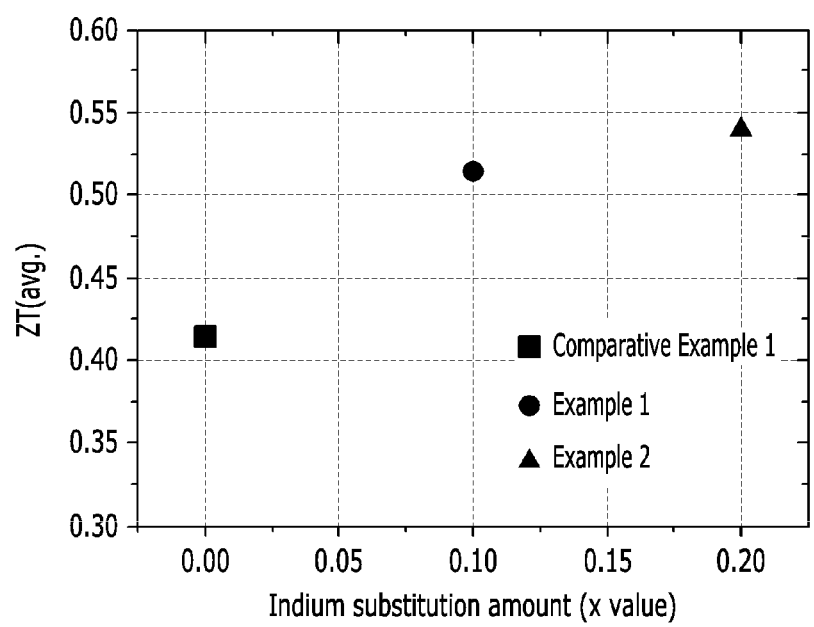
FIG. 11 is a graph showing the average values of the thermoelectric figures of merit according to an indium substitution amount in the chalcogen-containing compounds of Examples 1 and 2 and Comparative Example 1 (temperature region: 100~500° C.).
Figure 12:
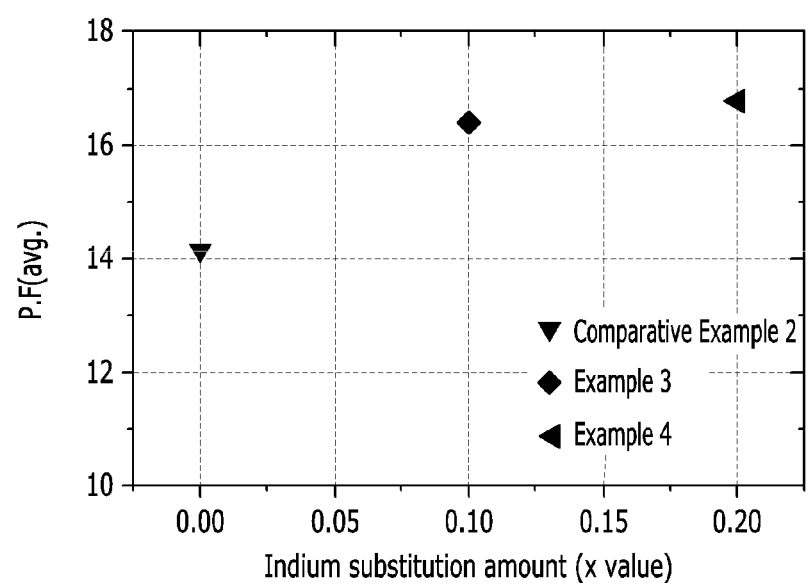
FIG. 12 is a graph showing the average power factors according to an indium substitution amount in the chalcogen-containing compounds of Examples 3 and 4 and Comparative Example 2 (temperature region: 100~500° C.).
Figure 13:
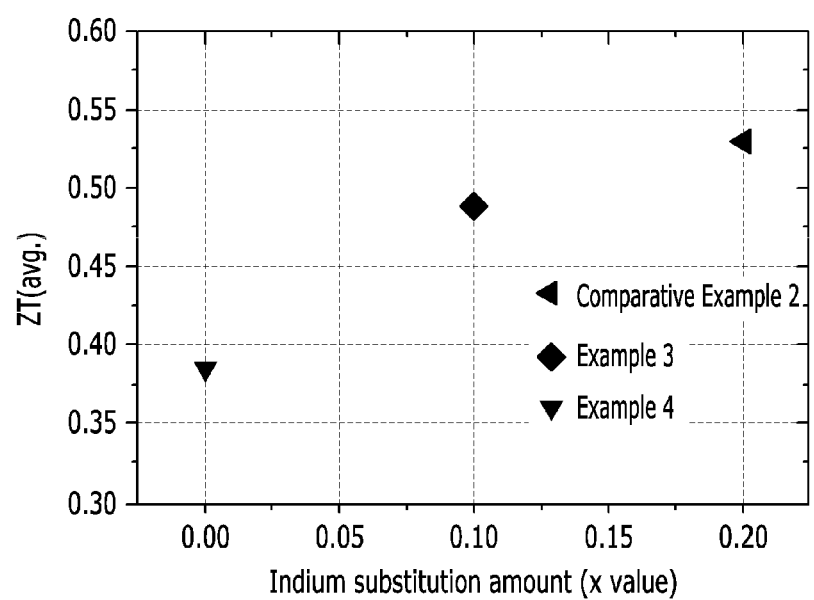
FIG. 13 is a graph showing the average values of the thermoelectric figures of merit according to an indium substitution amount in the chalcogen-containing compounds of Examples 3 and 4 and Comparative Example 2 (temperature region: 100~500° C.).

FIG. 10 is a graph showing the average values of power factors according to an indium substitution amount in the chalcogen-containing compounds of Examples 1 and 2 and Comparative Example 1, namely, the x value in Chemical Formula 1, and FIG. 11 is a graph showing the average values of thermoelectric figures of merits of these compounds. Further, FIG. 12 is a graph showing the average values of power factors according to an indium substitution amount in the chalcogen-containing compounds of Examples 3 and 4 and Comparative Example 2, and FIG. 13 is a graph showing the average values of thermoelectric figures of merits of these compounds. In FIGS. 10 to 13, the unit of the indium substitution amount is a mole.

TABLE 3

| | 100~500° C. average thermoelectric properties | | | |
| --- | --- | --- | --- | --- |
| | $PF_{average}$ (µW/cmK²) | $K_{tot, average}$ (W/mK) | $ZT_{average}$ | $ZT_{max}$ |
| Comparative Example 1 | 14.45 | 2.33 | 0.41 | 0.91 |
| Example 1 | 16.41 | 1.91 | 0.52 | 0.94 |
| Example 2 | 16.72 | 1.76 | 0.52 | 0.90 |
| Comparative Example 2 | 14.15 | 2.54 | 0.39 | 0.91 |
| Example 3 | 16.44 | 2.06 | 0.49 | 0.94 |
| Example 4 | 16.79 | 1.83 | 0.53 | 0.91 |

Referring to the average thermal conductivity at 100 to 500 in Table 3, it can be confirmed that in Examples 1 to 4, the average thermal conductivity decreased 18~28%, compared to Comparative Examples 1 and 2.

Meanwhile, from the results of average power factor of FIG. 10 (Examples 1 and 2 and Comparative Example 1) and FIG. 12 (Examples 3 and 4 and Comparative Example 2), it was confirmed that in case In is substituted at the Sn site, as the In substitution amount increases, the average power factor tends to be improved, particularly in the low temperature region. When calculating the average power factor in the 100 to 500° C. region with reference to Table 3, it can be confirmed that the average power factor at 100 to 500° C. of Examples 1 to 4 increased about 16~19%, compared to Comparative Examples 1 and 2.

Further, from the results of average thermoelectric figure of merit ($ZT_{ave}$) of FIG. 11 (Examples 1 and 2 and Comparative Example 1) and FIG. 13 (Examples 3 and 4 and Comparative Example 2), it can be confirmed that when In is substituted at the Sn site, as the substitution amount increases, the average value of thermoelectric figure of merit also increases. When calculating with reference to Table 3, it can be confirmed that the average ZT value at 100 to 500 of Examples 1 to 4 increased about 27~36% compared to Comparative Examples 1 and 2.

The invention claimed is:

1. A chalcogen-containing compound represented by the following Chemical Formula 1:

$$V_1Sn_{a-x}In_xSb_2Te_{a+3} \quad \text{[Chemical Formula 1]}$$

wherein,

V is a vacancy, $14 \leq a \leq 16$, and $0 < x \leq 0.5$.

2. The chalcogen-containing compound according to claim 1, wherein $0.01 \leq x \leq 0.2$.

3. The chalcogen-containing compound according to claim 1, wherein the chalcogen-containing compound has a face-centered cubic lattice structure.

4. The chalcogen-containing compound according to claim 3, wherein the V is a vacant site excluding sites filled with Sn, Sb, and Te in the face-centered cubic lattice structure, and the In is substituted for a part of Sn.

5. The chalcogen-containing compound according to claim 3, wherein the Te is filled in anionic sites of the face-centered cubic lattice structure, the Sn and Sb are filled in cationic sites of the face-centered cubic lattice structure, the In is substituted for a part of Sn, and the V is a vacant site of remaining cationic sites excluding sites filled with Sn, Sb, and In.

6. The chalcogen-containing compound according to claim 3, wherein the V, Sn, Sb, and In are randomly distributed at the site of (x, y, z)=(0, 0, 0), and Te is distributed at the site of (x, y, z)=(0.5, 0.5, 0.5).

7. The chalcogen-containing compound according to claim 1, wherein a is 14, and the chalcogen-containing compound has a face-centered cubic lattice structure, a lattice constant of 6.2850 Å to 6.2861 Å, and a weighted pattern R (Rwp) of 5.900 to 5.990.

8. The chalcogen-containing compound according to claim 1, wherein a is 16, and the chalcogen-containing compound has a face-centered cubic lattice structure, a lattice constant of 6.2880 Å to 6.2900 Å, and a weighted pattern R (Rwp) of 4.900 to 5.100.

9. The chalcogen-containing compound according to claim 1, wherein the chalcogen-containing compound is selected from the group consisting of $V_1Sn_{13.9}In_{0.1}Sb_2Te_{17}$, $V_1Sn_{13.8}In_{0.2}Sb_2Te_{17}$, $V_1Sn_{15.9}In_{0.1}Sb_2Te_{19}$, and $V_1Sn_{15.8}In_{0.2}Sb_2Te_{19}$.

10. A method for preparing the chalcogen-containing compound of claim 1, comprising the steps of:

mixing respective raw materials of Sn, Sb, Te, and In in amounts such that the mole ratio of Sn:Sb:Te:In is (a−x):2:(a+3):x, and subjecting the resultant mixture to a melting reaction;

heat-treating the resultant product obtained through the melting reaction;

pulverizing the resultant product obtained through the heat treatment; and sintering the pulverized product.

11. The method for preparing the chalcogen-containing compound according to claim 10, wherein the melting reaction is conducted at a temperature of 700° C. to 900° C.

12. The method for preparing the chalcogen-containing compound according to claim 10, wherein the heat treatment is conducted at a temperature of 550° C. to 640° C.

13. The method for preparing the chalcogen-containing compound according to claim 10, further comprising a step of cooling the resultant product of the heat treatment step to form an ingot, between the heat treatment step and the pulverization step.

14. The method for preparing the chalcogen-containing compound according to claim 10, wherein the sintering is conducted by a spark plasma sintering method, at a temperature of 550° C. to 640° C. and a pressure of 10 MPa to 100 MPa.

15. A thermoelectric element comprising the chalcogen-containing compound according to claim 1.

* * * * *